(12) United States Patent
Meir

(10) Patent No.: US 7,185,500 B2
(45) Date of Patent: Mar. 6, 2007

(54) ACTIVE COOLING SYSTEM FOR CPU

(75) Inventor: Ronen Meir, Ashkelon (IL)

(73) Assignee: Active Cool Research and Development Ltd, Elad (IL)

( * ) Notice: Subject to any disclaimer, the term of this patent is extended or adjusted under 35 U.S.C. 154(b) by 245 days.

(21) Appl. No.: 10/496,303

(22) PCT Filed: Nov. 28, 2003

(86) PCT No.: PCT/IL02/00960

§ 371 (c)(1),
(2), (4) Date: Dec. 29, 2004

(87) PCT Pub. No.: WO03/046702

PCT Pub. Date: Jun. 5, 2003

(65) Prior Publication Data

US 2005/0146850 A1    Jul. 7, 2005

(30) Foreign Application Priority Data

Nov. 29, 2001   (IL) ..................................... 146838

(51) Int. Cl.
F25B 21/02 (2006.01)
(52) U.S. Cl. ........................ 62/3.2; 62/259.2
(58) Field of Classification Search .................. 62/3.2, 62/3.3, 295.2; 165/80.2, 80.3
See application file for complete search history.

(56) References Cited

U.S. PATENT DOCUMENTS

| | | | |
|---|---|---|---|
| 4,631,728 A * | 12/1986 | Simons | ........................ 372/34 |
| 4,935,864 A | 6/1990 | Schmidt et al. | |
| 5,088,098 A * | 2/1992 | Muller et al. | .................. 372/34 |
| 5,569,950 A | 10/1996 | Lewis et al. | |
| 6,198,245 B1 | 3/2001 | Du et al. | |
| 6,400,045 B1 | 6/2002 | Hosokawa et al. | |
| 6,588,217 B2 * | 7/2003 | Ghoshal | ........................ 62/3.7 |
| 2001/0029740 A1 | 10/2001 | Evans et al. | |
| 2002/0092307 A1 * | 7/2002 | Ghoshal | ........................ 62/3.7 |

FOREIGN PATENT DOCUMENTS

| | | |
|---|---|---|
| DE | 29 805336 | 7/1998 |
| WO | 94 03849 | 2/1994 |
| WO | 01 69694 | 9/2001 |

* cited by examiner

Primary Examiner—Melvin Jones
(74) Attorney, Agent, or Firm—Dennison, Schultz & MacDonald

(57) ABSTRACT

A cooling system for cooling a processor installed within a computer case, the active cooling system comprising: (i) a TEC/heat-sink assembly comprising a thermoelectric cooling module (TEC) having a cold plate and a hot plate, the cold plate being coupleable to a processor, for removing heat from the processor, and the hot plate being coupled to a heat sink; (ii) a control microprocessor controllingly coupled to a power inverter, said power inverter for provision of high efficiency cooling to the processor by application of an appropriate voltage to the TEC; the control microprocessor being further coupled to (iii) a temperature sensor located on the cold plate of the TEC, for providing information to the microprocessor regarding temperature of the TEC; said cooling system being powered by a standard PC power supply having sufficient power to accommodate power demands of both the PC and the cooling system.

18 Claims, 7 Drawing Sheets

ACTIVE COOLING SYSTEM FOR CPU

FIELD OF THE INVENTION

The present invention relates to a device and method for actively cooling a computer microprocessor (CPU), preventing over-heating and facilitating higher switching speeds.

BACKGROUND OF THE INVENTION

As the state of the art computer processors become ever more powerful, their switching speeds are increasing, and there is a significant problem of processor overheating.

Existing solutions for cooling computer processors are proving inadequate to meet the heat dissipation requirements upon them, and this problem is becoming more serious as time passes.

The heat generated by a working CPU is a function of the density of transistors (CMOS devices) in the chip and of switching speed. Each CPU model had several versions of switching speed, and the switching speed and temperature were correlated.

The processors of early personal computers such as Intel's XT, 286 and 386 chips don't need heat dissipation. Their power consumption is low and they do not generally overheat. The more powerful and more recent 486 CPU chip needs a small heat sink, (generally an aluminium plate attached to the chip), to draw heat away from the chip and to facilitate its dissipation.

The Pentium CPU needs a heat sink and a fan to allow it to perform properly. The improved Pentium II model has a different structure, and is more powerful, and consequently generates more heat requiring dissipation. This CPU (and others such as the AMD Athlon CPU model) need a very large heat sink and fan, and sometimes two fans or more. As processors become ever more powerful, the need for more efficient cooling systems that are able to cope with increasing cooling demands is becoming more acute.

Since increasing the operating temperature of a CPU critically affects its reliability, and thus the reliability of the entire computer system it is a part of, the currently available cooling technologies are stretched to their limit. To enable further improvements in the computing power of personal computers it is necessary to further increase switching speeds.

To achieve this, it is imperative to decrease the CPU temperature.

Conventional cooling systems may be considered as being 'passive' systems. By this, it is meant that they remove heat from the CPU of the computer system allowing its temperature to approach the ambient temperature of the computer's surroundings. Since passive cooling solutions have evolved to a capability that is close to the theoretical limit for this type of technology, a new solution is needed.

Back in May 1996, an attempt was made by Marlow Industries, Inc., Dallas, Tex., USA, to provide an active cooling solution for preventing CPUs from overheating. Their solution was a simple device which was been marketed as their Model ST3404 PC chip cooler, and included a DT12-4 Thermoelectric cooler having a small heat sink. The cooler was mounted adjacent to the PC chip, and was coupled to the motherboard. It provided heat dissipation of up to 10 Watts and had a power input limit of 5 Volts DC, according to the manufacturer's data sheet. The Marlow device is powered by the power supply of the computer, hence has limited capabilities. Since it cannot receive sufficient power to dissipate the heat generated by current processors, its heat dissipation capacity is too low to meet the requirements of present day CPUs. Because of its inherent disadvantages, particularly it not being able to meet the cooling demands of later generations of CPUs power requirements, the Marlow device ceased to be marketed by the beginning of the year 2000. Its demise was linked to the availability of larger, passive cooling systems comprising heat sinks and fans that were more efficient than this small active cooling system.

Non-controlled thermoelectric units deliver maximum cooling under all conditions, including when the CPU is using low power or in"sleep mode". Overcooling may result in water vapour condensing on the unit's cold side, and this can lead to serious problems, particularly in some climates having high ambient temperatures and humidity levels.

Today, processors, such as the Pentium 4, XP ATHLON, TITANIUM, and others, produce 70 Watts or more of heat that requires to be dissipated to prevent the processors from overheating. Each successive generation of processors has a higher chip density and generates ever larger quantities of heat requiring dissipation. Current solutions, based on passive heat sinks and fans, are only just able to cope with currently available processors, enabling them to function reliably and stably. They will be unable to handle the expected heat dissipation demands of the next generation of processors.

Even when the average temperature of the processor is kept within acceptable limits, "hot spots" (local areas of high temperature within the processor), can cause instability, processor failure and damage. The average processor temperature achieved with current passive cooling solutions (consisting of a heat sink and fan) leaves only a small margin between the working CPU temperature and the maximum temperature permitted. In consequence, hot spots may cause serious problems. It is anticipated that as successive generations of processors will generate more heat, the problem of hot spots will become increasingly critical. A larger margin between the working CPU temperature and its maximum permissible temperature is required to protect from overheating, to ensure reliable, stable, operation, and to eliminate the need for slowed down processing, as practiced by the TCC function of the Intel Pentium 4 processor.

There is thus a need for new cooling systems for CPUs having higher heat dissipation ability than currently available systems. The present invention described hereinbelow, addresses this need.

SUMMARY OF THE INVENTION

It is an aim of the present invention to provide a system for cooling CPUs and the like, having larger cooling capabilities than conventional solutions consisting of fans and heat sinks.

It is a further aim to provide a method for cooling a CPU within a computer case.

In a first aspect, there is provided an active cooling system for cooling a processor installed within a computer case, the active cooling system comprising: (i) a TEC/heat-sink assembly comprising a thermoelectric cooling module (TEC) having a cold plate and a hot plate, the cold plate being coupleable to a processor, for removing heat from the processor, and the hot plate being coupled to a heat sink ; (ii) a control microprocessor controllingly coupled to a power inverter, said power inverter for provision of high efficiency cooling to the processor by application of a correct voltage to the TEC; the control microprocessor being further coupled to (iii) a temperature sensor located on the cold plate of the TEC, for providing information to the microprocessor regarding temperature of the TEC; said active cooling system being powered by a standard PC power supply having sufficient power to accommodate power demands of both the PC and the active cooling system.

Preferably, the microprocessor is programmed to detect rapid temperature changes of processor via said temperature sensor, allowing the microprocessor to predict heavy processor loads and to trigger maximum cooling.

Preferably, the power inverter drives the TEC by application of a correct voltage across the TEC. In some embodiments the power inverter is mounted inside the PC power supply, slightly modifying the standard PC power supply.

In other embodiments, components of the power inverter are located on a printed circuit board of the PC power supply and are connected via the printed circuit board to the DC voltage output (5V and 12V) of the PC power supply and include output wires and a connector for connecting the TEC/heat sink assembly with the temperature sensor.

In yet other embodiments, the power inverter driving the TEC is fabricated on a standard PCI card that is mountable in a PCI slot.

In still other embodiments, the power inverter driving the TEC is mountable onto a frame that fits into a standard drive bay, such as a 5¼" or a 3½" drive bay, and the active cooling system includes a digital display mounted on front panel of the frame, the digital display being connected to the temperature sensor; such that when operated, the temperature sensor determines the CPU temperature by sensing the temperature of the cold plate, and the control processor makes suitable adjustments by calibrating the difference between the cold plate temperature and the CPU "junction" temperature, so that the digital display shows the corrected CPU temperature.

In still yet other embodiments, the power inverter driving the TEC is mounted on the TEC/HEAT sink assembly.

In a second aspect, there is provided a method of cooling a processor within a computer case by an active cooling system as described herein, wherein the processor is connected to a power supply that is powerful enough to supply the demands of the processor and of the active cooling system, the method comprising the steps of: (a) providing an active cooling system including: (i) a thermoelectric cooling module (TEC) having a cold plate that is attached to said processor, said TEC for removing heat from said processor; (ii) a microprocessor for controlling the TEC that is connected to the TEC, that has a pulse-width modulated (PWM) control voltage output for controlling the TEC; (iii) a temperature sensor connected to said cold plate of said TEC; (iv) an inverter circuit between said power supply and said TEC (b) providing DC power from said power supply to said microprocessor; (c) converting analog input voltage from the temperature sensor into a digital signal suitable for said microprocessor by means of said analog-to-digital (A/D) converter; (d) tracking the signal from said temperature sensor, and changing the duty cycle of the TEC accordingly; (e) feeding the PWM signal' to an integrator, and applying the integrator output to the inverter, providing a feedback loop, (F) inverting the 12V DC supplied by the power supply to suitable voltage for the TEC elements, using said inverter.

Optionally, for use when less than maximum cooling power is required, the method includes the further step of: (g) reducing the output voltage used for powering the TEC in response to a signal from the microprocessor.

By appropriate temperature, a temperature such as the factory preset temperature is intended. This may be programmed into the microprocessor.

Optionally, the method further includes the step of providing the TEC with full power and maximum cooling capability in response to the microprocessor detecting a rapid rise in processor temperature.

There is also provided a method of cooling a processor installed inside a computer case using thermoelectric cooling (TEC) modules for removing heat powered by a standard PC power supply with a large enough power rating to accommodate the power demands of both the computer and the TEC units, the method including providing DC power from the computer's power supply to power a microprocessor to an integrated circuit, converting the analog input voltage from a temperature sensor to digital, in the microprocessor, perhaps by means of an analog-to-digital converter (A/D), tracking the temperature sensor signal using the microprocessor to obtain a pulse-width modulated (PWM) control voltage for changing the duty cycle of the TEC and feeding the PWM signal to an integrator, and applying the integrator output to the inverter, which acts as a feedback loop, inverting, by means of an inverter circuit, 12VDC from the power supply to suitable voltage for the TEC elements.

BRIEF DESCRIPTION OF THE DRAWINGS

The present invention will be further understood and appreciated from the following detailed description taken in conjunction with the drawings in which.

DETAILED DESCRIPTION OF THE INVENTION

The invention described herein is a cooling system for a CPU of a PC that uses a ThermoElectric Cooler (TEC) component. It will be appreciated however, that the invention may be attached to, and used to cool other semiconductor components.

TECs which use the Peltier effect are well-known components that are widely used in the electronics industry. When direct current is supplied to the TEC component, one side thereof becomes colder and the other side hotter. The component actually pumps heat from the cold side to the hot side. The increase in temperature of the hot side is partly due to heat pulled from the cold side, and partly due to the low efficiency of the TEC component which generates additional heat. Since thermoelectric components have a low efficiency, and require high power for their operation, TECs were generally not considered to be useful for cooling CPUs.

There are many models of TECs (thermoelectric components) readily available, each having different characteristics and requiring a different power input. For cooling an advanced CPU, a high-power TEC or several low-power TECs may be required.

Figure 1:
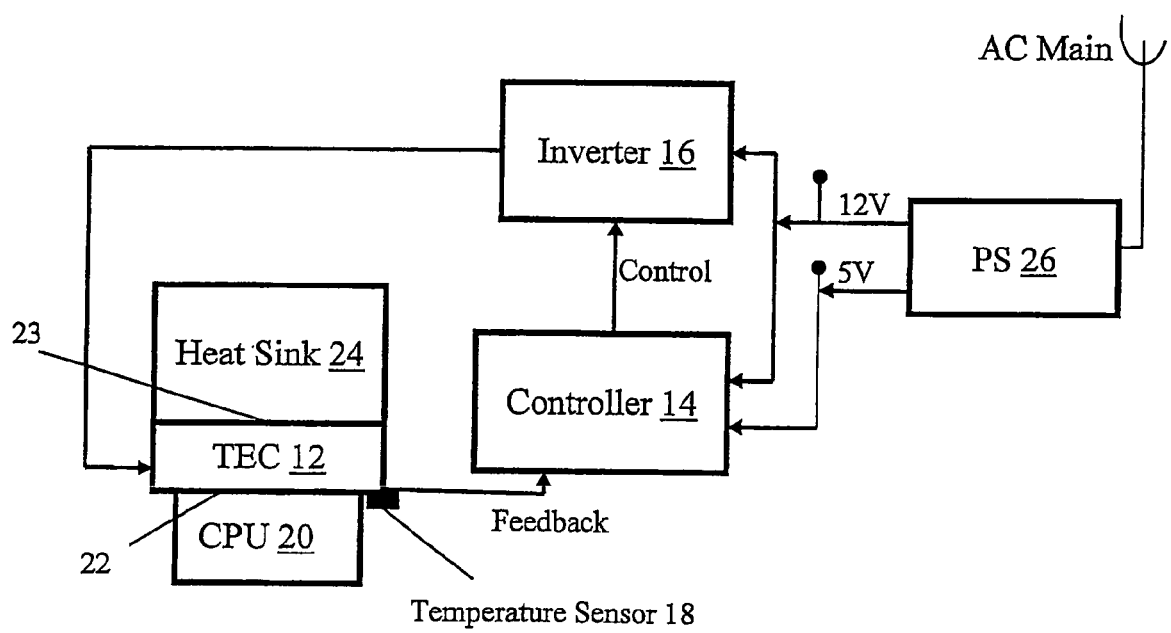
FIG. 1 is a block diagram of a cooling system for the CPU of a computer in accordance with the present invention.

Referring now to FIG. 1, the current invention is a cooling system 10 for a processor. It consists of at least one TEC 12, a controller 14, a power inverter 16 (Cool Card) and a temperature sensor 18.

The TEC 12 may be located on a CPU 20 so that the CPU 20 is coupled to the cold plate 22 of the TEC 12. A heat sink 24 is preferably coupled to the hot plate 23 of the TEC 12, and when operated, the TEC actively pumps heat away from the CPU 20. The temperature sensor 18 is also coupled to the cold plate 22 of the TEC and is further connected to the controller 14, typically a control microprocessor, providing it with continuous information regarding the temperature of the CPU 20. The power inverter 16 (Cool Card) is connected to the controller 14 and to the TEC 12 and provides the optimal voltage to the TEC 12 as determined by the controller 14. In this manner the temperature of the CPU 20 can be controlled using feedback from the temperature sensor 18.

Preferably, the controller 14 is programmed to detect rapid changes in the temperature of the CPU 20, allowing the cooling system 10 to predict heavy processor load and to trigger maximum cooling before temperatures reach unacceptable levels.

Also shown, there is a computer power supply (PS) 26 that may be coupled to the electric grid (mains), and that accepts AC power from the electric grid. The power supply 26 supplies 5 V DC and 12 V DC to the controller 14; and 12 V DC to the inverter 16. The controller 14 controls the output power of the TEC 12.

By having microprocessor control of the TEC, responding to real time temperature fluctuations as determined using the temperature sensor, highly efficiency cooling is provided to the CPU. An additional advantage of this arrangement is that condensation is prevented at all CPU loads.

It is noteworthy that, unlike the conventional cooling systems of the prior art, the present invention can cool the CPU to below the ambient surrounding temperature.

The present invention is available in various embodiments, or "form factors." For example, in one form factor the Cool Card driving the TEC is mounted inside the power supply of the PC itself, making some minor modifications to the power supply of the PC. In a second form factor, the Cool Card driving the TEC is produced on a standard PCI card and mounted in a PCI slot. In a third form factor, the Cool Card driving the TEC is mounted in a frame that fits into a standard port of a computer, such as a 5¼" or 3½" DISK drive bay for example. In a fourth form factor, the Cool Card driving the TEC is mounted on the TEC/heat sink assembly.

Figure 2A:
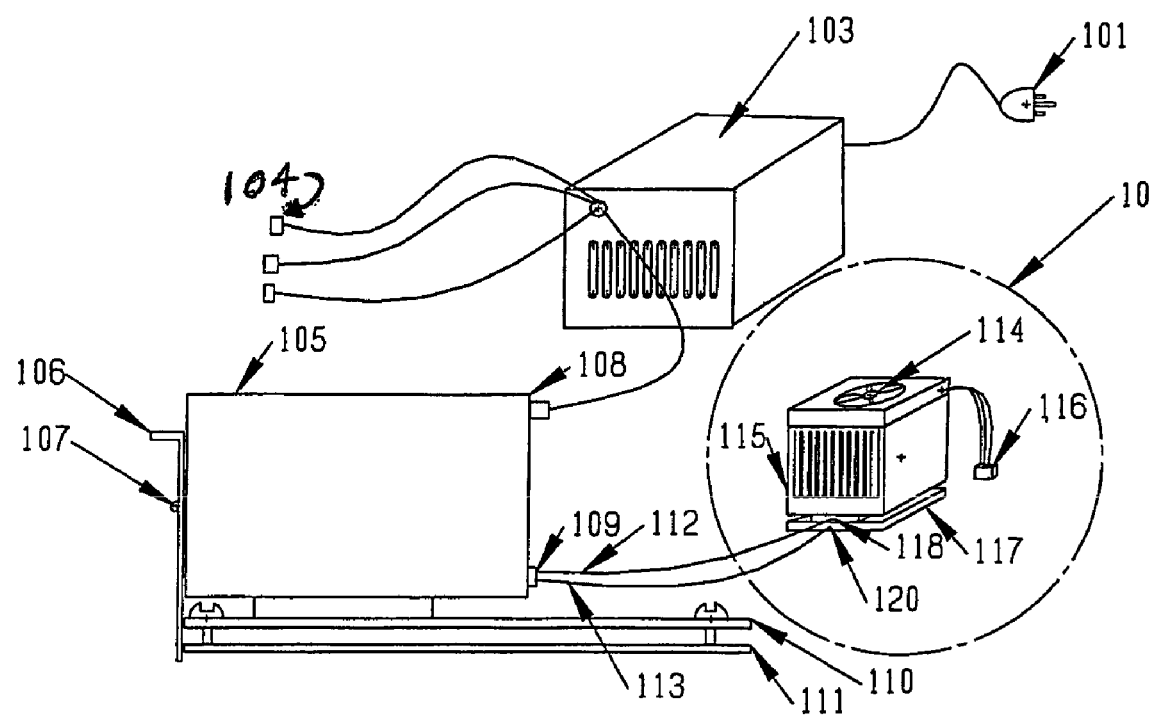
FIGS. 2a and 2b are schematic illustrations of a cooling system for a computer CPU in accordance with a first embodiment of the present invention, wherein the Cool Card is a PCI card.
Figure 2B:
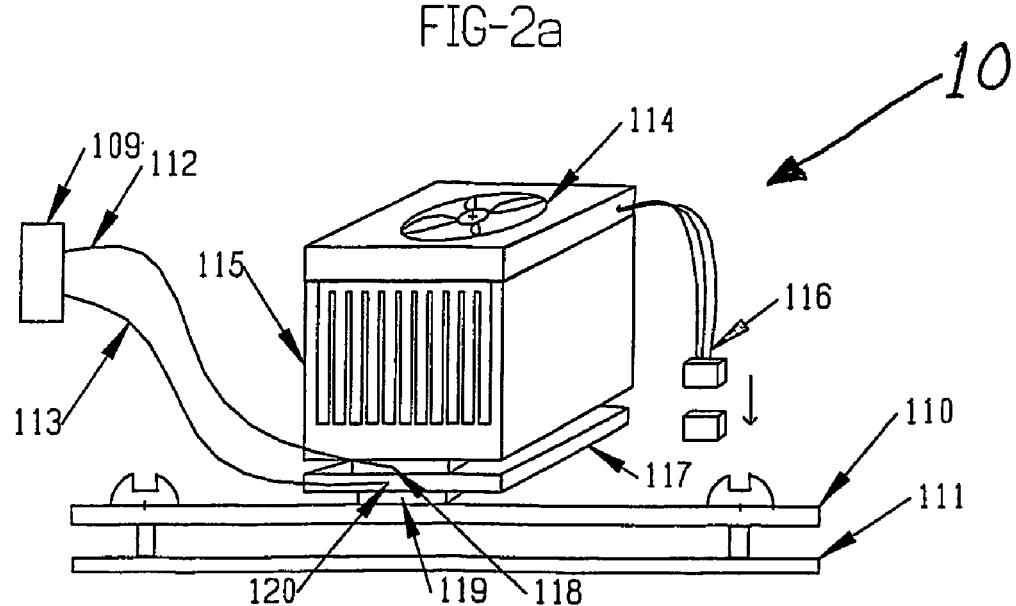
Figure 5:
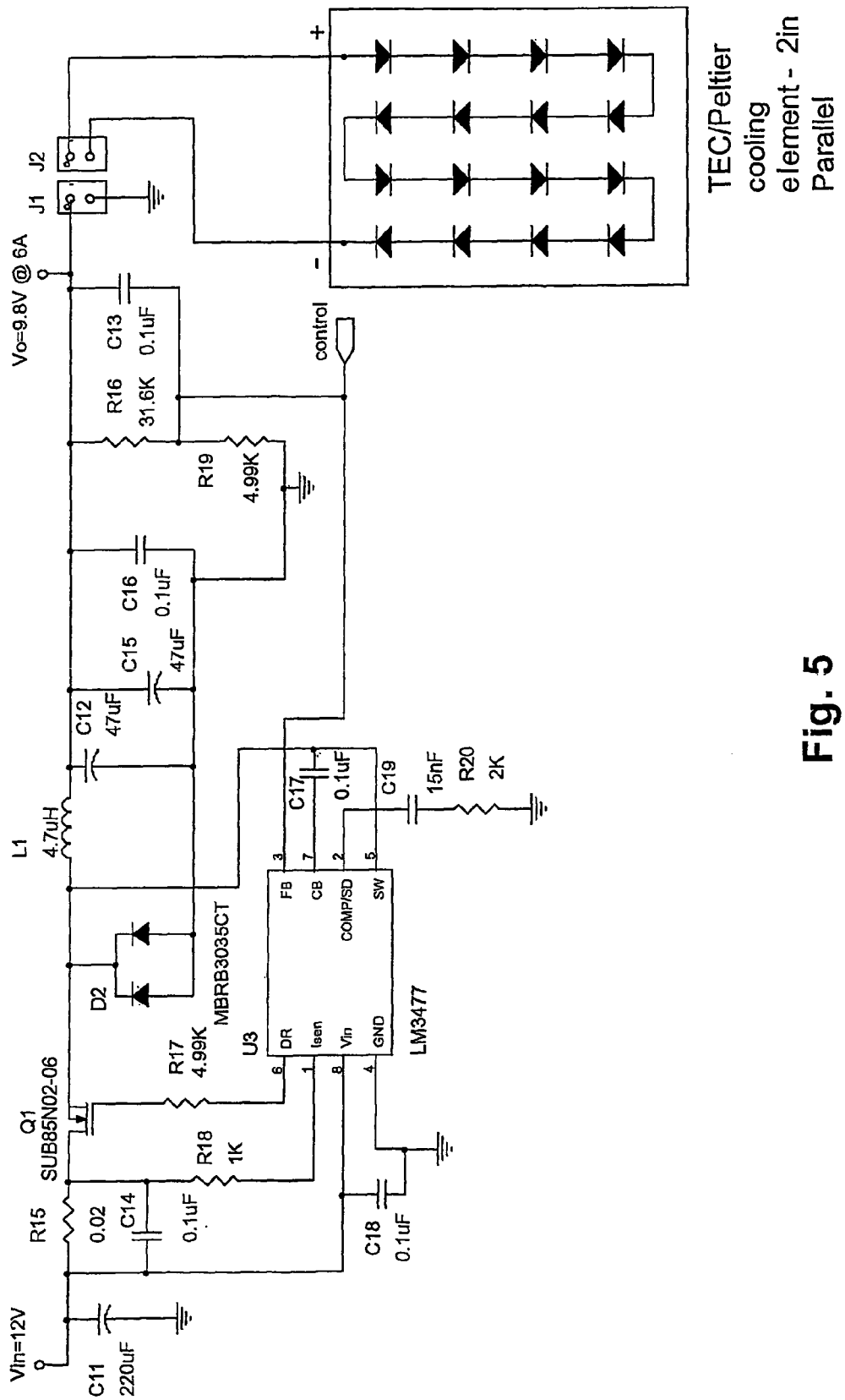
FIG. 5 is a circuit diagram of the inverter and the TEC.
Figure 6:
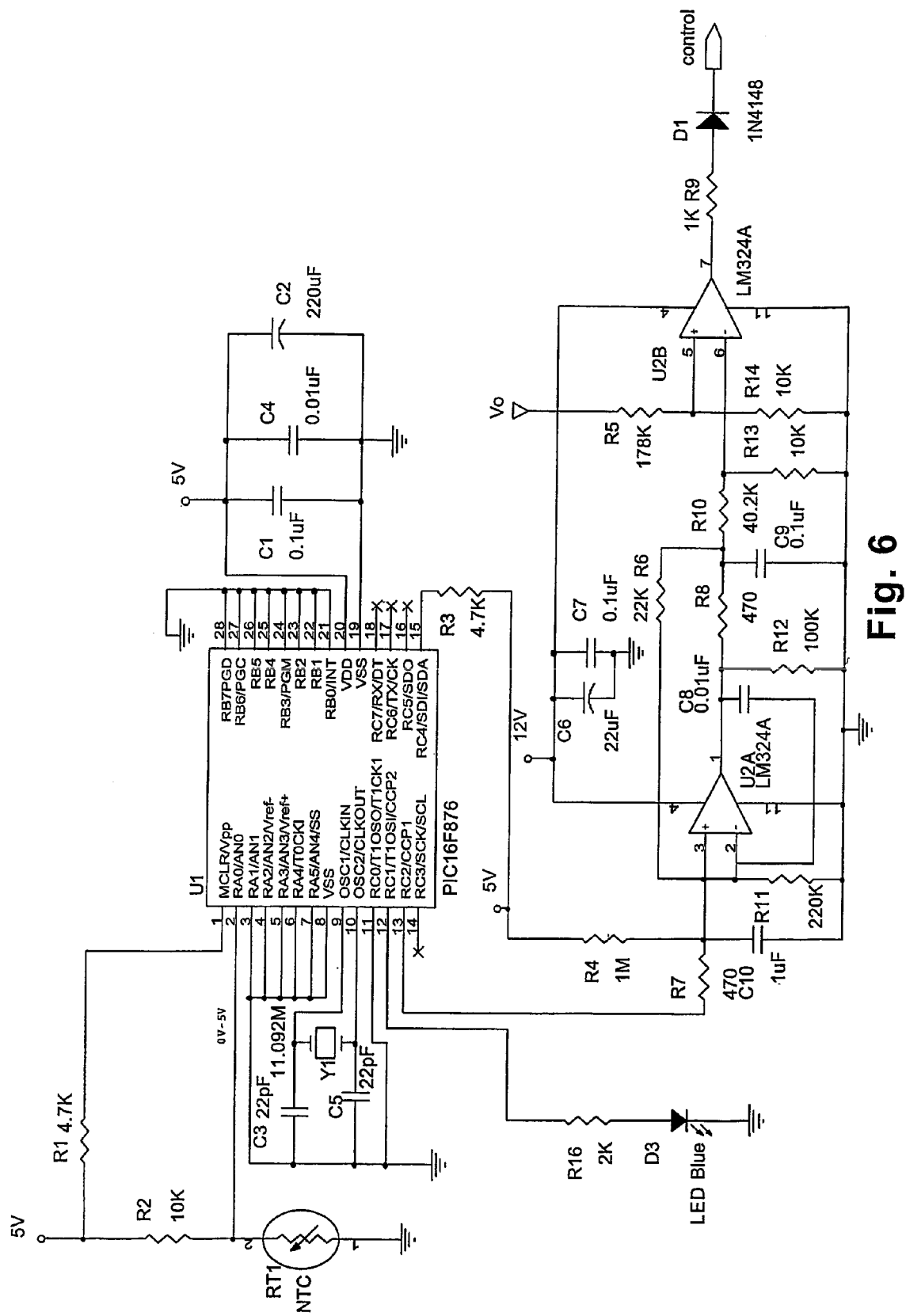
FIG. 6 is a circuit diagram of the microprocessor control circuits, (the controller and converter).

Reference is now made to FIGS. 2a and 2b, which shows the parts of one embodiment of the present invention, including a Cool Card having a PCI slot 'form factor' 105. The power cord 101 is connected to the electrical mains and provides power to the computer power supply 103. One of the standard output connectors 108 of the computer power supply 103 is connected to the Cool Card having a PCI slot form factor 105. The Cool Card having a PCI slot form factor 105 is inserted in a PCI slot 104 on the motherboard 110 attached to the computer chassis 111. The PCI card is locked in place by a screw through the mounting bracket 106. Optionally, a blue indicator LED 107 is mounted on the mounting bracket 106, providing an indication that active cooling is being practiced, it being appreciated that, due to inherent cost, blue LEDs are rarely used. Exemplary circuit diagrams of the inverter and the microprocessor control circuits are shown in FIGS. 5 and 6 respectively. The controlled-power output of the Cool Card is supplied at output connector 109 via wires 112 to the TEC element 118. The temperature sensor 120 is connected via a wire 113 to the connector 109. The cold-side of the TEC element 118 is attached to the cold plate 117 which is typically made of aluminum, copper or an alloy thereof. The cold plate 117 is thermally coupled to the processor 119. The hot side of the TEC element 118 is attached to a heat sink 115, from which heat is dispersed by forced air convection cooling, using a fan 114. Fan 114 is connected to the motherboard 110 by a connector 109, from which it receives power.

Figure 3A:
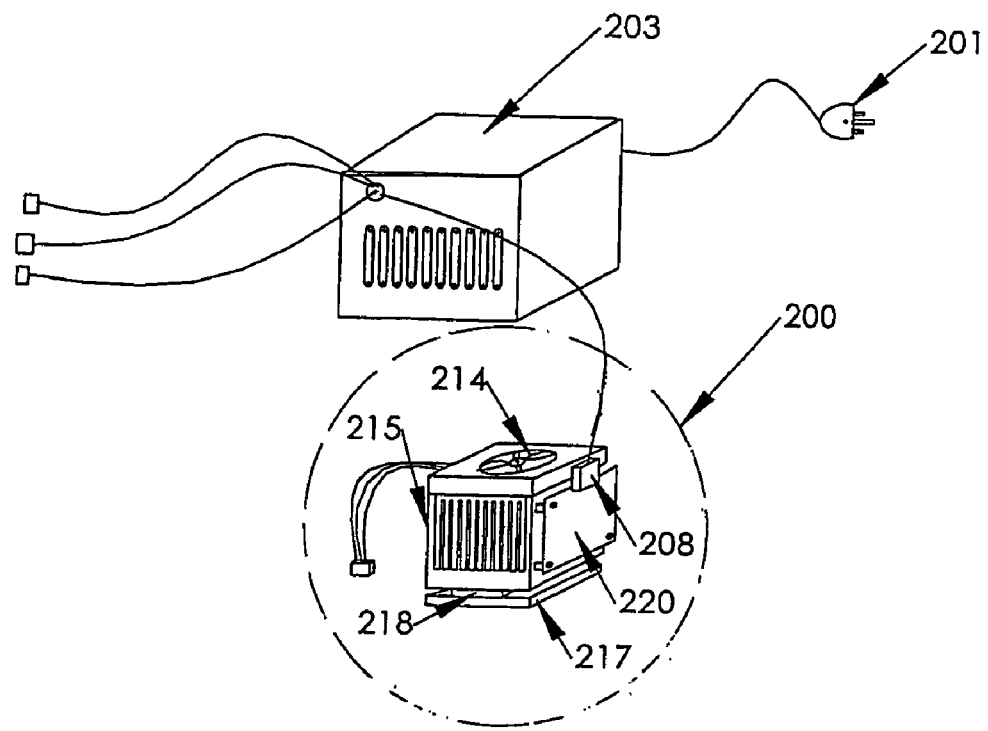
FIGS. 3a and 3b are schematic illustrations of a cooling system for a computer CPU in accordance with a second embodiment of the present invention. In this embodiment, the form factor is that of a Cool Card mounted on the TEC/heat sink assembly.
Figure 3B:
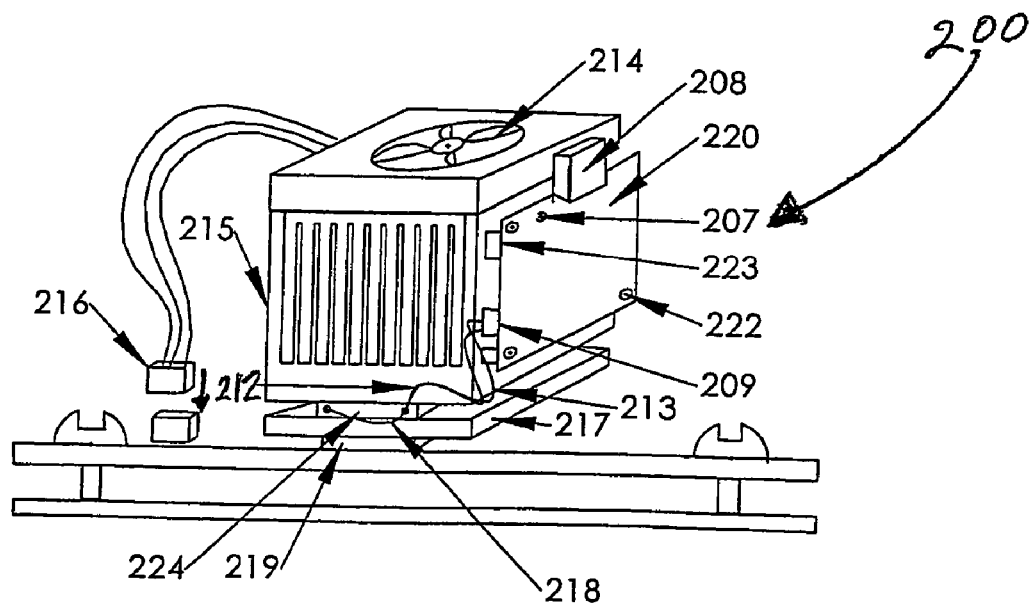

With reference now to FIGS. 3a and 3b, there is shown the parts of a second embodiment of the present invention: a Cool Card 220 having the form factor of being mounted on the TEC/HEAT sink assembly 200. Power cord 201 is connected to the electrical mains, providing power to the computer power supply 203. One of the standard output connectors 208 of the computer power supply 203 is connected to the Cool Card 220 mounted on the side of the TEC 217/heat sink 215 assembly. The cool card 220 is mounted onto the heat sink 215, but separated therefrom by spacers 223, and is fastened in place with appropriate fastening means, such as screws 222 for example. A blue indicator LED 207 is mounted onto the cool card 220. The controlled-power output of the Cool Card is supplied at output connector 209 via wires 212 to the TEC element 218. The temperature sensor 224 is connected via wire 213 to connector 209. The cold side of the TEC element 218 is attached to the cold plate 217, which is typically aluminum, copper or an alloy thereof, and is thermally coupled to the processor 219. The hot side of the TEC element 218 is attached to the heat sink 215, which is cooled by forced air blown thereon, from the fan 214. Fan 214 receives power via connector 216, which is connected to the motherboard, from which it receives power. Again, appropriate circuit diagrams for the Cool Card 220 electronic circuitry, the controller and the converter are shown in FIGS. 5 and 6.

Figure 4A:
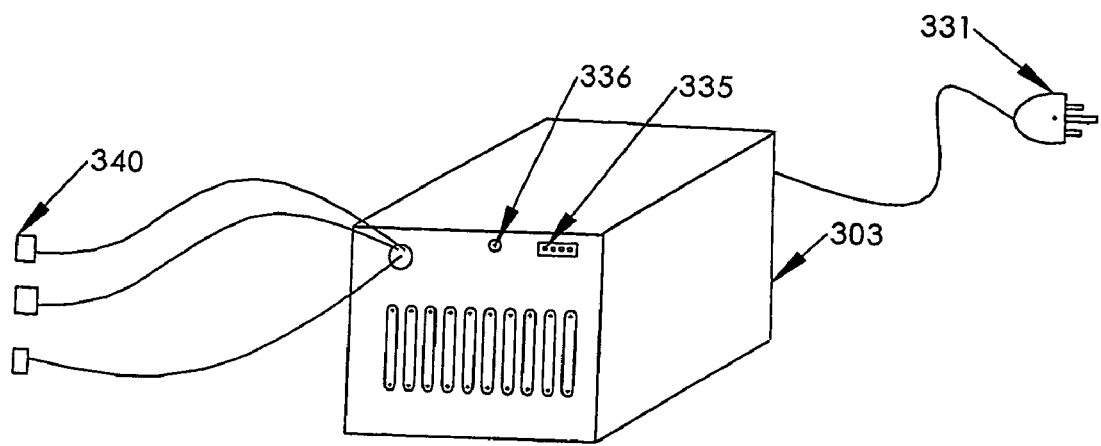
FIGS. 4a and 4b are schematic illustrations of a cooling system for a computer CPU in accordance with a third embodiment of the present invention, having the form factor of a Cool Card mounted inside a custom modified computer power supply.
Figure 4B:
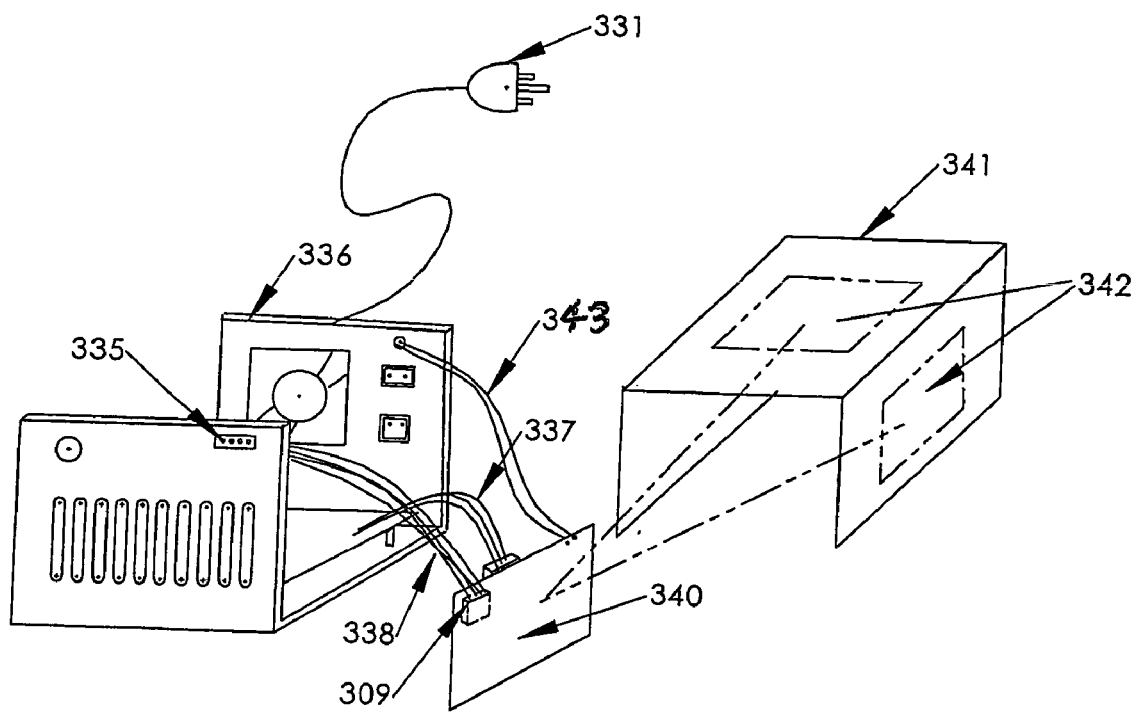

FIGS. 4a and 4b show a third embodiment of the present invention, wherein the Cool Card has the form factor of being mounted inside a modified computer power supply.

Here, power cord 331 is connected to the electrical mains, providing power to the computer power supply 303, and the Cool Card 340 is mounted inside the power supply 303, and receives 12 V DC and 5 V DC from the power supply board via wire 337. Preferably, a blue indicator LED 336 is mounted on the outside of the power supply 303 and is connected to the Cool Card 340 via wire 343. The controlled-power output of the Cool Card is supplied at output connector 309 via wires 338 to connector 335, located on the side of the power supply facing the interior of the computer.

The connector 335 may be coupled via connector 109 (FIG. 2), supplying power for the TEC 118 (FIG. 2) and further coupled via wire 113 (FIG. 2) to temperature sensor 120 (FIG. 2) located on cold plate 117 (FIG. 2). The cold side of the TEC element 118, (FIG. 2) is attached to the aluminum or copper cold plate 117, (FIG. 2), which is thermally coupled to the processor 119, (FIG. 2). The hot side of the TEC element 118 (FIG. 2) is attached to the heat sink 115 (FIG. 2), which has heated dissipated therefrom, by forced air currents generated by fan 114 (FIG. 2). Fan 114 (FIG. 2) receives power via the connector 116 (FIG. 2), which is connected to the motherboard, drawing power thereby. Once again, appropriate electronic circuitry for the Cool Card 340 is shown in FIGS. 5 and 6.

The Cool Card 340 is mounted inside the power supply 303 and can be attached to the power supply cover 341 on the inside of the top of the power supply or on the side 342 thereof. Indeed, the Cool Card 340 may be mounted at any other available location inside the power supply, due to its small form factor.

FIG. 5 is a circuit diagram showing the inverter circuit, which inverts 12 V DC from the power supply to a suitable voltage for powering the TEC elements. Also shown, are the connection to the TEC, and the TEC. TEC elements are MAXIMALLY efficient at less than the 12 V DC available from the power supply. In consequence, the voltage is adjusted for maximum efficiency. By way of example, the circuit in FIG. 5 is a step down inverter adjusted for output voltage of 9.8 V DC, 6 Amps. This is suitable for powering 2 TEC units connected in parallel, of the DT12-6 type manufactured by Marlow Industries.

It will be appreciated of course, that this circuit diagram is included by way of example only, for the purpose of showing one way of realizing the invention. Other inverter circuits (not shown), may be suitable for some embodiments. One alternative circuit is that of a step-up inverter that steps up the voltage to 19.6 V DC, 3 Amps, suitable for powering 2 TEC units connected in series. It should be noted, that the output voltages given herein, are for maximum cooling power. When less than maximum cooling power is required, the feedback loop signal from the microprocessor will reduce the output voltage, and proportionally, the cooling power. In this manner, the processor may be kept at a desired temperature, such as at the factory preset temperature, which may be set via the microprocessor software, for example. In this way, at low processor loads, cooling will be at the preset temperature, preventing condensation and reducing the power consumption of the Cool Card.

When the microprocessor detects a rapid rise in processor temperature, it predicts that the processor is operating at full load and will reach maximum temperature. In such a case, the TEC will receive full power and maximum cooling capability.

With reference now to FIG. 6, there is shown one possible circuit diagram for a microprocessor control circuit for controlling the operation of the inverter circuit (FIG. 5) of the cooling system of the present invention. Here, DC power, perhaps from the computer's power supply, provides 5 V DC to the microprocessor U1, and 12 V DC to integrated circuit U2. The controller-U1 is coupled to an analog-to-digital converter (A/D), which converts the analog input voltage coming into U1-PIN 2 from the temperature sensor, to a digital signal.

The microprocessor output U1-pin 13 is a pulse-width modulated (PWM) control voltage, which tracks the output of temperature sensor (RT1), changing the duty cycle accordingly.

The PWM signal is fed to the integrator via U2-pin 3. The integrator output U2-pin 7 is applied to the inverter U3-pin 3 (FIG. 5), which acts as a feedback loop.

Figure 7:
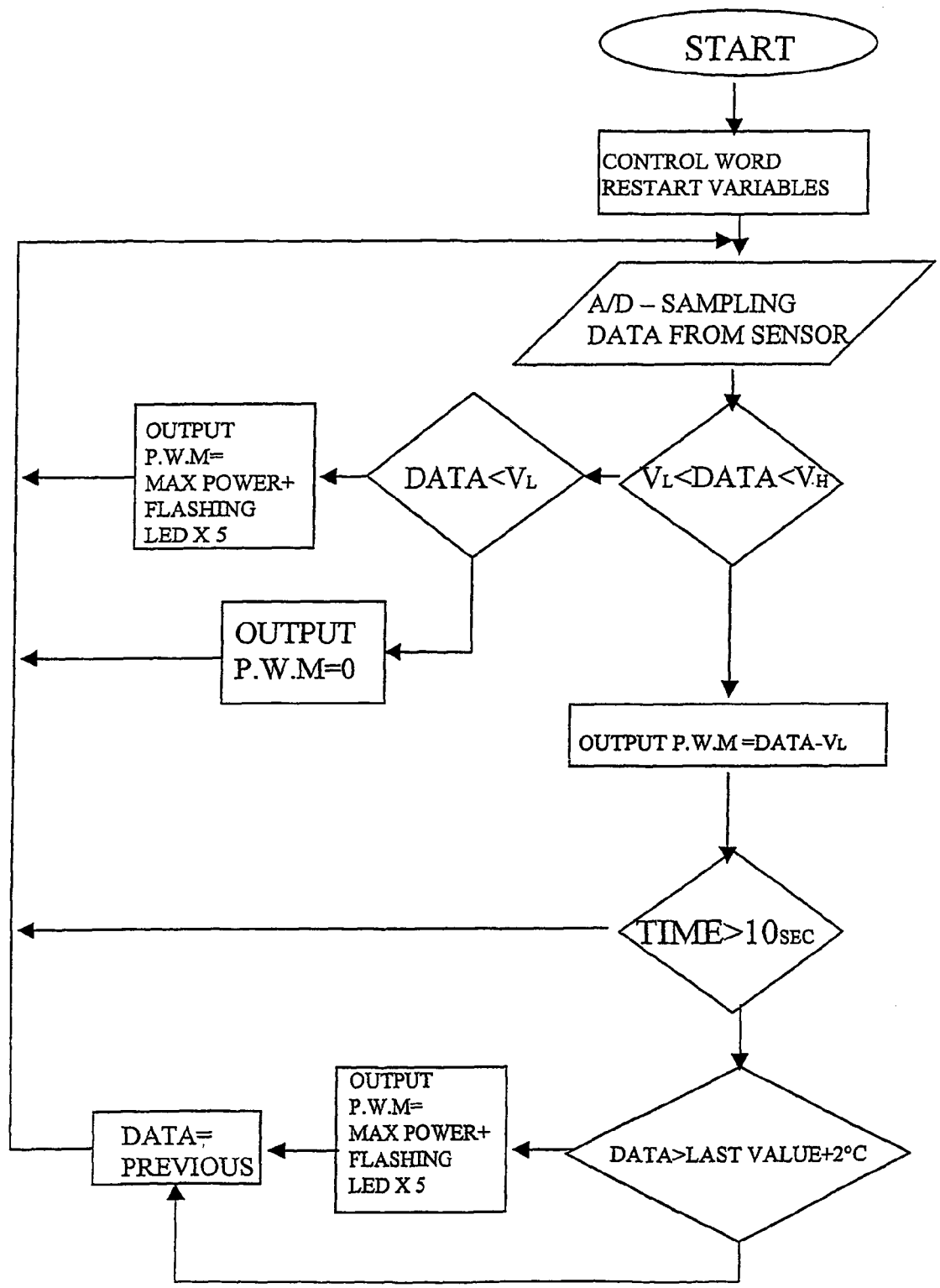
FIG. 7 is a flow chart of the microprocessor software.

Referring now to FIG. 7, there is shown a flow chart of the microprocessor operation, having a feedback loop which controls the output voltage applied to the power switching (MOSFET) transistor Q1 (FIG. 5), which receives 12 V DC from the computer power supply. Q1 is controlled by a feedback signal received via U3-pin3 (FIG. 5).

It will thus be noted that the active cooling system of the present invention is a generic device which may be mounted in any PC. Several embodiments (form factors) have been described hereinabove, by way of example only. The invention is not limited to what has been described above. Rather, the invention is limited solely by the claims that follow, wherein the word "comprise", and variations thereof such as "comprising", "comprised"and the like, indicate that the specified components or steps are included, but not generally to the exclusion of other non specified components or steps.

The invention claimed is:

1. A cooling system for cooling a processor installed within a computer case, said cooling system comprising:
   (i) a TEC/heat-sink assembly comprising a thermoelectric cooling module (TEC) having a cold plate and a hot plate, the cold plate being coupleable to a processor, for removing heat from the processor, and the hot plate being coupled to a heat sink from which heat is dispersed by forced air convection cooling using a fan;
   (ii) a control microprocessor controllingly coupled to a power inverter, said power inverter for provision of high efficiency cooling to the processor by application of an appropriate voltage to the TEC; the control microprocessor being further coupled to
   (iii) a temperature sensor located on the cold plate of the TEC, for providing information to the microprocessor regarding temperature of the TEC; said cooling system being powered by a standard PC power supply having sufficient power to accommodate power demands of both the PC and the cooling system.

2. The cooling system of claim 1, wherein the microprocessor is programmed to detect rapid temperature changes of processor via said temperature sensor, allowing the microprocessor to predict heavy processor loads and to trigger maximum cooling.

3. The cooling system of claim 1, wherein said power inverter drives said TEC by application of a correct voltage across the TEC; said power inverter being mounted inside the PC power supply and minorly modifying said PC power supply.

4. The cooling system of claim 1, wherein components of the power inverter are located on a printed circuit board of the PC power supply and are connected via said printed circuit board to the DC voltage output (5V and 12V) of the PC power supply and include output wires and a connector for connecting the TEC/heat sink assembly with the temperature sensor.

5. The cooling system of claim 1, wherein the power inverter driving the TEC is fabricated on a standard PCI card that is mountable in a PCI slot.

6. The cooling system of claim 1, wherein the power inverter driving the TEC is mountable onto a frame that fits into a standard port, such as a 5¼" drive bay or a 3½" drive bay; the active cooling system including a digital display mounted on front panel of said frame; the digital display being connected to the temperature sensor; such that when operated, the temperature sensor reads the CPU temperature by taking measurements from the cold plate, and the digital display shows the CPU temperature reading, adjusted by the microprocessor to show a junction temperature by calibrating the difference between the cold plate temperature and the CPU "JUNCTION" TEMPERATURE.

7. The cooling system of claim 1, wherein the power inverter driving the TEC is mounted on the TEC/heat sink assembly.

8. A method of cooling a processor within a computer case, utilizing a cooling system, wherein the processor and the cooling system are connected to a power supply that is powerful enough to supply power demands of the processor and of the cooling system, the method comprising the steps of: (a) providing a cooling system including: (i) a thermo-electric cooling module (TEC) having a cold plate that is attached to said processor, said TEC for removing heat from said processor; (ii) a microprocessor that is connected to the TEC, for controlling the TEC, having a pulse-width modulated (PWM) control voltage output for controlling the TEC; (iii) a temperature sensor connected to said cold plate of said TEC; (iv) an inverter circuit between said power supply and said TECI (b) providing DC power from said power supply to said microprocessor; (c) converting analog input voltage from the temperature sensor into a digital signal suitable for said microprocessor; (d) tracking the signal from said temperature sensor, and changing duty cycle of said TEC accordingly; (e) feeding the PWM signal to an integrator, and applying the integrator output to the inverter; (f) inverting the 12V DC supplied by the power supply to suitable voltage for the TEC elements, using said inverter.

9. The method according to claim 8, for use when less than maximum cooling power is required, including the further step of: (g) reducing the voltage across the TEC in response to a signal from the microprocessor.

10. The method according to claim 9, wherein an appropriate temperature, such as the factory preset temperature, is programmed into the microprocessor.

11. The method according to claim 8, further including the step of providing the TEC with full power and maximum cooling capability in response to the microprocessor detecting a rapid rise in processor temperature.

12. The method according to claim 9, further including the step of providing the TEC with full power and maximum cooling capability in response to the microprocessor detecting a rapid rise in processor temperature.

13. The method according to claim 10, further including the step of providing the TEC with full power and maximum cooling capability in response to the microprocessor detecting a rapid rise in processor temperature.

14. The cooling system of claim 2, wherein said power inverter drives said TEC by application of a correct voltage across the TEC; said power inverter being mounted inside the PC power supply and minorly modifying said PC power supply.

15. The cooling system of claim 2, wherein components of the power inverter are located on a printed circuit board of the PC power supply and are connected via said printed circuit board to the DC voltage output (5V and 12V) of the PC power supply and include output wires and a connector for connecting the TEC/heat sink assembly with the temperature sensor.

16. The cooling system of claim 2, wherein the power inverter driving the TEC is fabricated on a standard PCI card that is mountable in a PCI slot.

17. The cooling system of claim 2, wherein the power inverter driving the TEC is mountable onto a frame that fits into a standard port, such as a 5¼" drive bay or a 3½" drive bay; the active cooling system including a digital display mounted on front panel of said frame; the digital display being connected to the temperature sensor; such that when operated, the temperature sensor reads the CPU temperature by taking measurements from the cold plate, and the digital display shows the CPU temperature reading, adjusted by the microprocessor to show a junction temperature by calibrating the difference between the cold plate temperature and the CPU "junction" temperature.

18. The cooling system of claim 2, wherein the power inverter driving the TEC is mounted on the TEC/heat sink assembly.

* * * * *